(12) United States Patent
Yokota et al.

(10) Patent No.: US 12,381,069 B2
(45) Date of Patent: Aug. 5, 2025

(54) PLASMA PROCESSING APPARATUS AND PLASMA PROCESSING METHOD

(71) Applicant: Tokyo Electron Limited, Tokyo (JP)

(72) Inventors: Akihiro Yokota, Miyagi (JP); Ryo Terashima, Miyagi (JP); Tomo Murakami, Miyagi (JP); Takaharu Saino, Miyagi (JP)

(73) Assignee: Tokyo Electron Limited, Tokyo (JP)

( * ) Notice: Subject to any disclaimer, the term of this patent is extended or adjusted under 35 U.S.C. 154(b) by 110 days.

(21) Appl. No.: 18/462,258

(22) Filed: Sep. 6, 2023

(65) Prior Publication Data
US 2023/0420228 A1 Dec. 28, 2023

Related U.S. Application Data

(63) Continuation of application No. PCT/JP2022/011950, filed on Mar. 16, 2022.

(30) Foreign Application Priority Data

Mar. 23, 2021 (JP) .................................. 2021-048689

(51) Int. Cl.
*H01J 37/32* (2006.01)
(52) U.S. Cl.
CPC .. *H01J 37/32669* (2013.01); *H01J 37/32082* (2013.01); *H01J 37/32449* (2013.01); *H01J 37/32935* (2013.01)
(58) Field of Classification Search
CPC ........... H01J 37/32669; H01J 37/32082; H01J 37/32449; H01J 37/32935
See application file for complete search history.

(56) References Cited

U.S. PATENT DOCUMENTS

| | | | | |
|---|---|---|---|---|
| 11,742,180 | B2* | 8/2023 | Koshimizu | ....... H01J 37/32568 118/723 R |
| 12,154,793 | B2* | 11/2024 | Nagami | ............ H01J 37/32568 |
| 2010/0304572 | A1* | 12/2010 | Koshimizu | ....... H01J 37/32091 156/345.28 |

(Continued)

FOREIGN PATENT DOCUMENTS

| | | |
|---|---|---|
| JP | 2006-216605 A | 8/2006 |
| JP | 2014-158005 A | 8/2014 |

(Continued)

OTHER PUBLICATIONS

International Search Report issued in PCT/JP2022/011950; mailed Jun. 14, 2022.

*Primary Examiner* — Adam D Houston
(74) *Attorney, Agent, or Firm* — Studebaker Brackett PLLC

(57) ABSTRACT

A disclosed plasma processing apparatus includes a chamber, a plasma generator, a plurality of annular electromagnet units, a power source, at least one optical sensor, and a controller. The plurality of annular electromagnet units are provided coaxially with respect to an axis passing through an internal space of the chamber. The at least one optical sensor detects an emission intensity distribution of plasma along a radial direction in the chamber. The controller controls a power source to adjust currents respectively supplied to the plurality annular electromagnet units according to the emission intensity distribution.

17 Claims, 8 Drawing Sheets

(56) References Cited

U.S. PATENT DOCUMENTS

| | | | | |
|---|---|---|---|---|
| 2012/0175063 A1* | 7/2012 | Yamawaku | ........ | H01L 21/67069 156/345.46 |
| 2015/0325413 A1* | 11/2015 | Kim | .................. | H01J 37/32082 315/111.21 |
| 2019/0295825 A1* | 9/2019 | Tsujimoto | ......... | H01J 37/32834 |
| 2020/0075296 A1* | 3/2020 | Ohashi | .............. | H01J 37/32669 |
| 2021/0074511 A1* | 3/2021 | Yokota | ................ | H01J 37/3244 |
| 2021/0159049 A1* | 5/2021 | Kubota | ............. | H01J 37/32091 |
| 2022/0020576 A1* | 1/2022 | Torii | .................. | H01J 37/32642 |
| 2022/0076930 A1* | 3/2022 | Saijo | .................. | H01J 37/32706 |
| 2022/0336194 A1* | 10/2022 | Yokohara | .......... | H01J 37/32651 |
| 2023/0326716 A1* | 10/2023 | Kamata | ............. | H01J 37/32238 |
| 2023/0411118 A1* | 12/2023 | Matsudo | ............. | H01L 21/3065 |
| 2023/0420228 A1* | 12/2023 | Yokota | ................ | H01L 21/3065 |
| 2024/0203701 A1* | 6/2024 | Kwon | ............... | H01J 37/32422 |

FOREIGN PATENT DOCUMENTS

| | | | | |
|---|---|---|---|---|
| JP | 2015-179775 A | | 10/2015 | |
| JP | 2021-044535 A | | 3/2021 | |
| TW | 201724255 A | | 7/2017 | |
| WO | WO-2021024823 A1 * | | 2/2021 | ........... C23C 16/505 |
| WO | WO-2022202551 A1 * | | 9/2022 | ........ H01J 37/32082 |
| WO | WO-2025013657 A1 * | | 1/2025 | |

* cited by examiner

PLASMA PROCESSING APPARATUS AND PLASMA PROCESSING METHOD

CROSS-REFERENCE TO RELATED APPLICATIONS

This application is a continuation application of PCT Application No. PCT/JP2022/011950, filed on Mar. 16, 2022, which claims the benefit of priority from Japanese Patent Application No. 2021-048689, filed on Mar. 23, 2021. The entire contents of the above listed PCT and priority applications are incorporated herein by reference.

BACKGROUND

Field

Exemplary embodiments of the present disclosure relate to a plasma processing apparatus and a plasma processing method.

Description of the Related Art

A plasma processing apparatus is used in plasma processing on a substrate. The plasma processing apparatus includes a chamber, a placing table, a gas supply, and a radio frequency power source. The placing table is disposed in the chamber. The gas supply supplies gas into the chamber. The radio frequency power source supplies radio frequency power to generate plasma from the gas in the chamber.

Japanese Unexamined Patent Publication No. 2014-158005 discloses a plasma processing apparatus that uses a plurality of electromagnets to adjust a distribution of a density of plasma in a chamber.

SUMMARY

In one exemplary embodiment, there is provided a plasma processing apparatus. The plasma processing apparatus includes a chamber, a substrate support, a gas supply, a plasma generator, a plurality of annular electromagnet units, at least one optical sensor, at least one power source, and a controller. The chamber has an internal space. The substrate support is disposed in the internal space of the chamber. The gas supply is configured to supply processing gas into the internal space of the chamber. The plasma generator is configured to generate plasma from the processing gas in the internal space of the chamber. The plurality of annular electromagnet units are disposed above the internal space of the chamber and disposed coaxially with respect to an axis passing through the internal space. Each of the plurality of annular electromagnet units has one or more electromagnets. The at least one optical sensor is configured to detect an emission intensity distribution of plasma in the internal space along a radial direction with respect to the axis. The at least one power source is configured to individually supply a current to the plurality of annular electromagnet units. The controller is configured to adjust the currents respectively supplied from the at least one power source to the plurality of annular electromagnet units based on the emission intensity distribution of the plasma detected by the at least one optical sensor.

The foregoing summary is illustrative only and is not intended to be in any way limiting. In addition to the illustrative aspects, exemplary embodiments, and features described above, further aspects, exemplary embodiments, and features will become apparent by reference to the drawings and the following detailed description.

BRIEF DESCRIPTION OF THE DRAWINGS

Each of FIG. 6A

DETAILED DESCRIPTION

Figure 1:
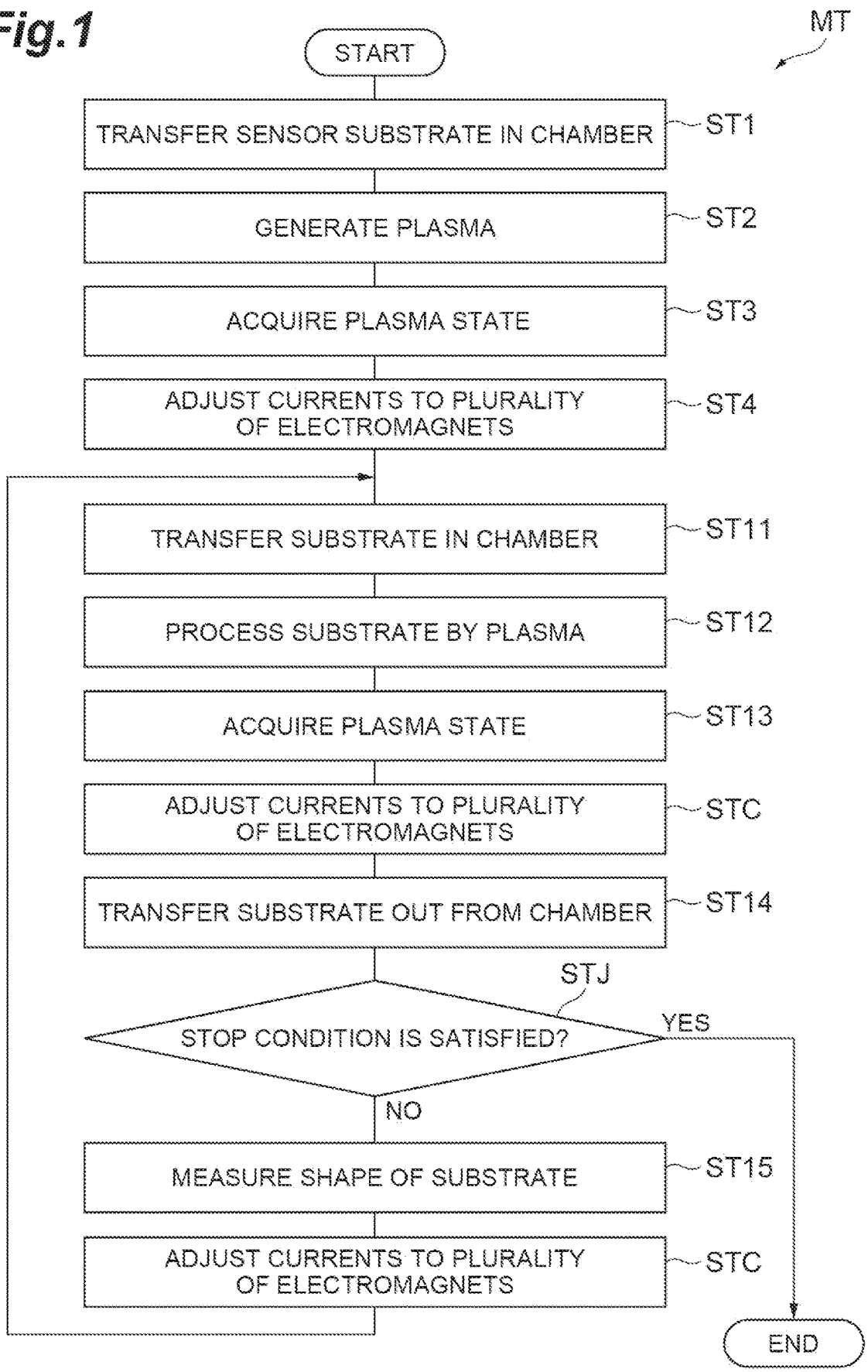
FIG. 1 is a flowchart showing a plasma processing method according to one exemplary embodiment.

Hereinafter, various exemplary embodiments will be described.

In one exemplary embodiment, there is provided a plasma processing apparatus. The plasma processing apparatus includes a chamber, a substrate support, a gas supply, a plasma generator, a plurality of annular electromagnet units, at least one optical sensor, at least one power source, and a controller. The chamber has an internal space. The substrate support is disposed in the internal space of the chamber. The gas supply is configured to supply processing gas into the internal space of the chamber. The plasma generator is configured to generate plasma from the processing gas in the internal space of the chamber. The plurality of annular electromagnet units are disposed above the internal space of the chamber and disposed coaxially with respect to an axis passing through the internal space. Each of the plurality of annular electromagnet units has one or more electromagnets. The at least one optical sensor is configured to detect an emission intensity distribution of plasma in the internal space along a radial direction with respect to the axis. The at least one power source is configured to individually supply a current to the plurality of annular electromagnet units. The controller is configured to adjust the currents respectively supplied from the at least one power source to the plurality of annular electromagnet units based on the emission intensity distribution of the plasma detected by the at least one optical sensor.

In one exemplary embodiment, each of the plurality of annular electromagnet units may include at least one annular electromagnet.

In one exemplary embodiment, each of the plurality of annular electromagnet units may include a plurality of electromagnets arranged along a circumferential direction with respect to the axis. Each of the plurality of electromagnets may include a bobbin having a columnar shape and a coil wound around the bobbin.

In one exemplary embodiment, the plasma processing apparatus may include a plurality of optical sensors as the at least one optical sensor. The plurality of optical sensors may be disposed above the internal space. The plurality of optical sensors are configured to detect the emission intensity distribution of the plasma. The plurality of optical sensors may be arranged along the radial direction.

In one exemplary embodiment, the at least one optical sensor may be disposed along a side wall of the chamber.

In one exemplary embodiment, the controller may be configured to adjust the current supplied to the plurality of annular electromagnet units to reduce a difference between the emission intensity distribution detected by the at least one optical sensor and a desired emission intensity distribution.

In one exemplary embodiment, the substrate support may include a temperature control mechanism configured to adjust a temperature distribution of a substrate placed on the substrate support.

In one exemplary embodiment, the gas supply may be configured to adjust a distribution of a flow rate of the processing gas along the radial direction.

In one exemplary embodiment, the controller may be configured to adjust the currents respectively supplied from the at least one power source to the plurality of annular electromagnet units based on a shape of the substrate. The shape of the substrate may be measured in the chamber or outside the chamber by a shape measuring device.

In another exemplary embodiment, there is provided a plasma processing method using the plasma processing apparatus. The plasma processing apparatus includes a chamber, a substrate support, a gas supply, a plasma generator, a plurality of annular electromagnet units, at least one optical sensor, and at least one power source. The plasma processing method includes (a) detecting an emission intensity distribution of plasma by the at least one optical sensor. The plasma processing method further includes (b) adjusting currents respectively supplied from the at least one power source to the plurality of annular electromagnet units based on the emission intensity distribution of the plasma.

In one exemplary embodiment, in the operation (b), the currents respectively supplied to the plurality of annular electromagnet units may be adjusted from a plasma state. The plasma state may be the emission intensity distribution of the plasma, or may be a distribution of a density or an amount of chemical species in the plasma obtained from the emission intensity distribution.

In one exemplary embodiment, the plasma processing method may further include measuring a plasma state generated in the chamber using a sensor substrate placed on the substrate support. The plasma processing method may further include adjusting the currents respectively supplied from the at least one power source to the plurality of annular electromagnet units based on the plasma state measured using the sensor substrate.

In one exemplary embodiment, the sensor substrate may be configured to measure a flux distribution of ions or radicals supplied to the sensor substrate as the plasma state.

In one exemplary embodiment, a shape of a substrate corresponding to a plasma state based on the emission intensity distribution acquired by using the at least one optical sensor may be identified from data prepared in advance. The data is data indicating a relationship between a plurality of plasma states and shapes of the substrate respectively obtained in the plurality of plasma states, and is prepared in advance. In the operation (b), the currents respectively supplied from the at least one power source to the plurality of annular electromagnet units may be adjusted to reduce a difference between the identified shape of the substrate and a desired shape of the substrate.

In one exemplary embodiment, the plasma processing method further includes (c) processing a substrate by plasma generated in the chamber. A shape of the substrate processed in the operation (c) may be measured. In the operation (b), the currents respectively supplied from the at least one power source to the plurality of annular electromagnet units may be adjusted to reduce a difference between a plasma state based on the emission intensity distribution acquired by the at least one optical sensor and a desired plasma state and to reduce a difference between the measured shape of the substrate and a desired shape of the substrate.

Hereinafter, various exemplary embodiments will be described in detail with reference to the drawings. In the drawings, the same or equivalent portions are denoted by the same reference symbols.

FIG. 1 is a flowchart showing a plasma processing method according to one exemplary embodiment. The plasma processing method (hereinafter, referred to as a "method MT") shown in FIG. 1 is performed using the plasma processing apparatus.

Figure 2:
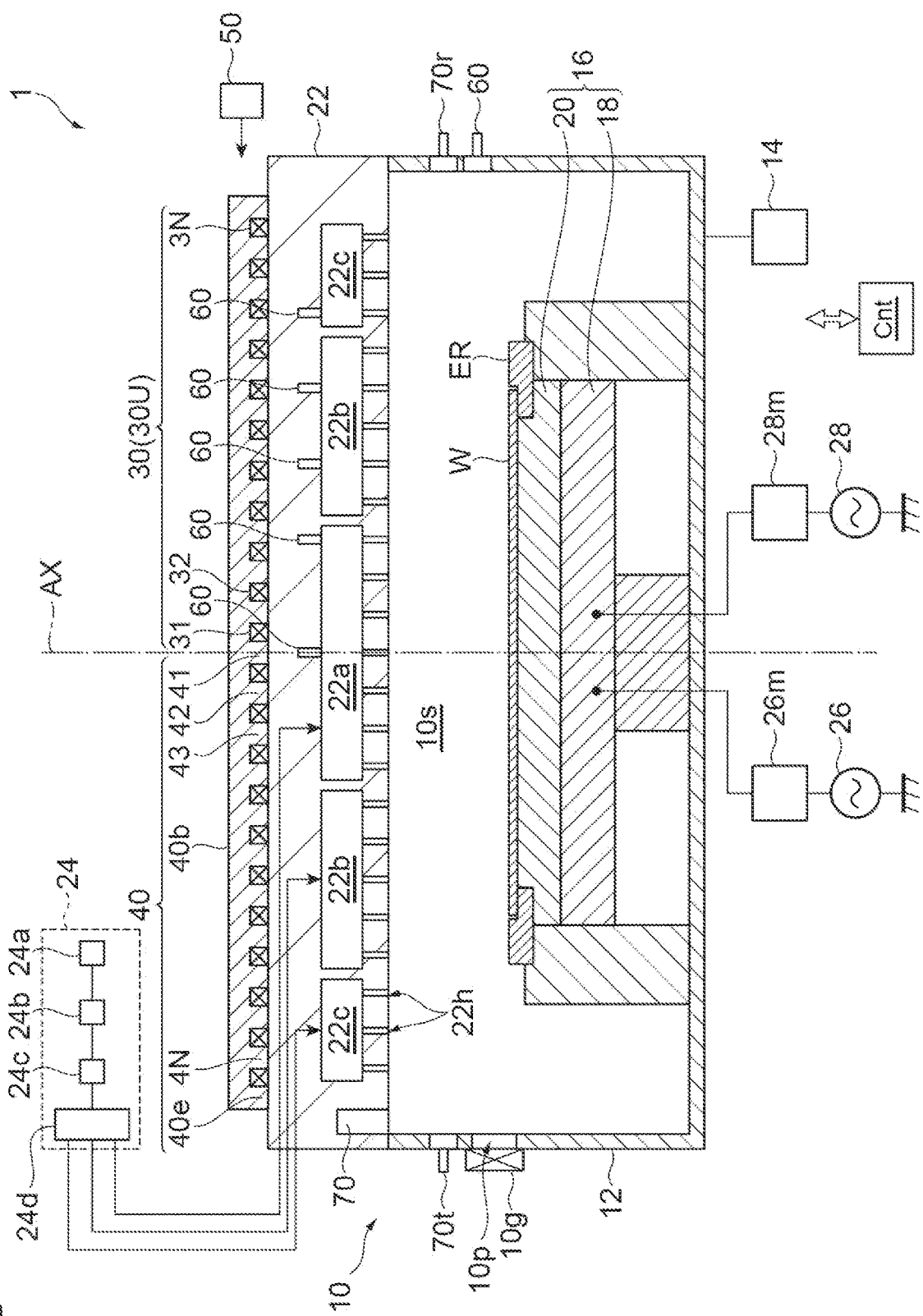
FIG. 2 is a diagram showing a plasma processing apparatus according to one exemplary embodiment.

FIG. 2 is a diagram showing the plasma processing apparatus according to one exemplary embodiment. A plasma processing apparatus 1 shown in FIG. 2 may be used in the method MT. The plasma processing apparatus 1 is a capacitively coupled plasma processing apparatus. The plasma processing apparatus 1 includes a chamber 10.

The chamber 10 has a substantially cylindrical shape, and an internal space 10s is provided in the chamber 10. An axis AX shown in FIG. 2 is a central axis of the chamber 10 and the internal space 10s, and extends in a vertical direction. The chamber 10 may include a chamber body 12. The chamber body 12 has a substantially cylindrical shape. The chamber body 12 is formed of metal such as aluminum, and is grounded. The internal space 10s is provided inside the chamber body 12. The internal space 10s can be decompressed by an exhaust device 14.

A passage 10p is provided in a side wall of the chamber 10. A substrate W passes through the passage 10p when it is transferred between an inside and an outside of the chamber 10. The passage 10p is opened and closed by a gate valve 10g. The gate valve 10g is disposed along the side wall of the chamber 10.

The plasma processing apparatus 1 further includes a substrate support 16. The substrate support 16 is disposed in the chamber 10. The substrate support 16 is configured to support the substrate W placed thereon. A central axis of the substrate support 16 coincides with the axis AX.

In one embodiment, the substrate support 16 may include a base 18 and an electrostatic chuck 20. The base 18 is formed of a conductive material such as aluminum and has a substantially disk shape.

Figure 3:
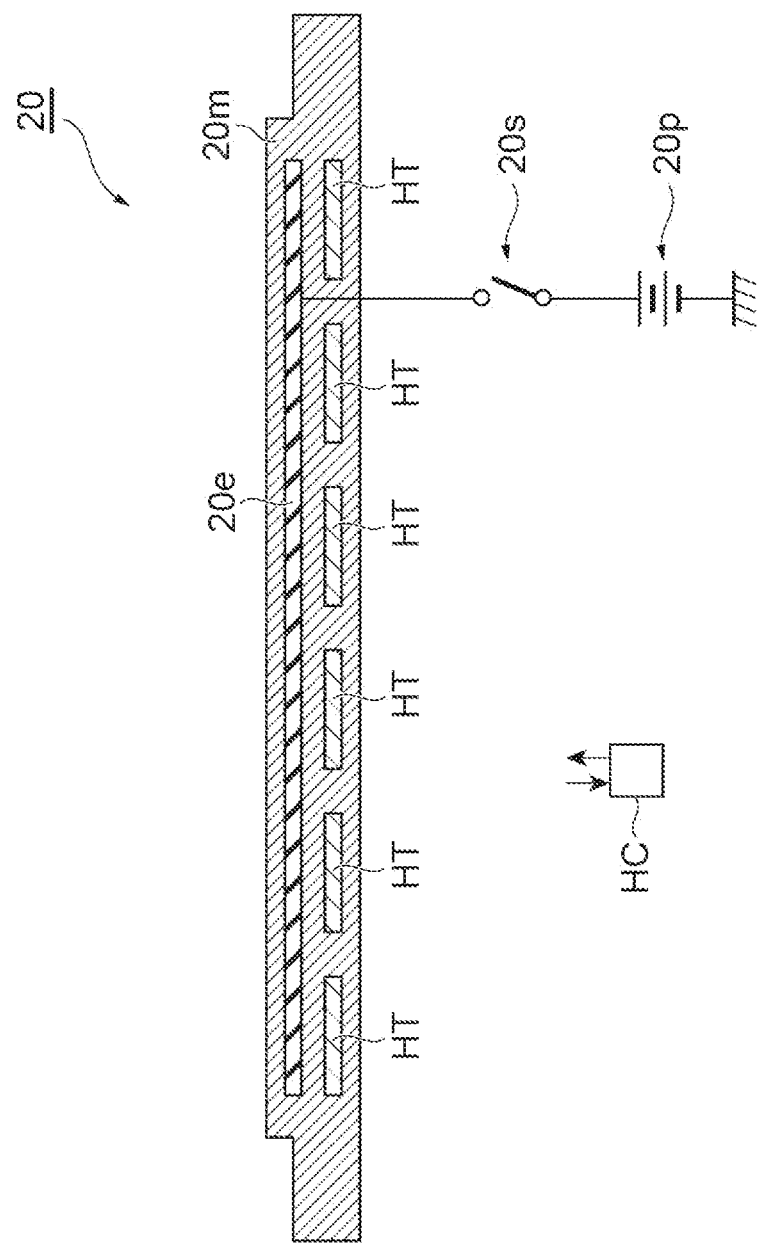
FIG. 3 is a sectional view of an electrostatic chuck in the plasma processing apparatus according to one exemplary embodiment.

The electrostatic chuck 20 is disposed on the base 18. FIG. 3 is a sectional view of an electrostatic chuck in the plasma processing apparatus according to one exemplary embodiment. As shown in FIG. 3, the substrate W is placed on the electrostatic chuck 20 such that a center thereof is located on the axis AX. The substrate W may have a diameter of, for example, 300 mm. The substrate support 16 may be configured to further support an edge ring ER placed thereon. The substrate W is disposed on the electrostatic chuck 20 and in a region surrounded by the edge ring ER.

The electrostatic chuck 20 has a main body 20m and an electrode 20e. The main body 20m is formed of a dielectric such as aluminum nitride and aluminum oxide. The main body 20m has a substantial disk shape. The electrode 20e is a conductive film and is disposed in the main body 20m. The electrode 20e is connected to a power source 20p via a switch 20s. When a DC voltage from the power source 20p is applied to the electrode 20e, an electrostatic attraction force is generated between the electrostatic chuck 20 and the substrate W. Due to the generated electrostatic attraction force, the substrate W is attracted to the electrostatic chuck 20 and held by the electrostatic chuck 20.

The substrate support 16 may have a temperature control mechanism. The temperature control mechanism of the substrate support 16 is configured to adjust a temperature distribution of the substrate W. In one embodiment, the substrate support 16 may have a plurality of heaters HT as the temperature control mechanism. Each of the plurality of heaters HT is, for example, a resistance heating element. Each of the plurality of heaters HT generates heat by receiving a current individually applied from a heater controller HC. The plurality of beaters HT are disposed below a plurality of regions of the substrate W, respectively. The plurality of heaters HT may be disposed in the electrostatic chuck 20 as shown in FIG. 3.

The plasma processing apparatus 1 further includes an upper electrode 22. The upper electrode 22 is disposed above the substrate support 16. The upper electrode 22 closes an upper end opening of the chamber body 12. The upper electrode 22 also functions as a shower head. In one embodiment, a plurality of gas diffusion chambers 22a to 22c and a plurality of gas holes 22h are provided in the upper electrode 22. The number of the gas diffusion chambers may be any number of two or more.

The plurality of gas diffusion chambers 22a to 22c are provided concentrically in the upper electrode 22. A central axis of the plurality of gas diffusion chambers 22a to 22c is the axis AX. The gas diffusion chamber 22a is a space that has a circular shape in a plan view and intersects the axis AX. The plurality of gas diffusion chambers 22b to 22c are spaces that have a substantial annular shape. The gas diffusion chamber 22b is provided on the outside of the gas diffusion chamber 22a in the radial direction. The gas diffusion chamber 22c is provided on the outside of the gas diffusion chamber 22b in the radial direction. Each of the plurality of gas holes 22h extends downward from a corresponding gas diffusion chamber among the plurality of gas diffusion chambers 22a to 22c, and is open toward the internal space 10s.

The plasma processing apparatus 1 further includes a gas supply 24. The gas supply 24 is configured to supply processing gas into the chamber 10. In one embodiment, the gas supply 24 is configured to adjust a distribution of a flow rate of the processing gas supplied to the substrate W along the radial direction of the substrate W. In one embodiment, the gas supply 24 is configured to supply the processing gas into the chamber 10 via the shower head described above, and is configured to individually supply the processing gas to each of the plurality of gas diffusion chambers 22a to 22c.

The gas supply 24 may include a gas source group 24a, a flow rate controller group 24b, a valve group 24c, and a flow splitter 24d. The gas source group 24a includes one or more gas sources. Gases from the one or more gas sources constitute the processing gas. The flow rate controller group 24b includes one or more flow rate controllers. The valve group 24c includes one or more on-off valves. Each of the one or more gas sources of the gas source group 24a is connected to the flow splitter 24d via a corresponding flow rate controller of the flow rate controller group 24b and a corresponding on-off valve of the valve group 24c. The flow splitter 24d is configured to distribute the supplied processing gas to the plurality of gas diffusion chambers 22a to 22c.

The flow splitter 24d can adjust a distribution ratio of the processing gas to the plurality of gas diffusion chambers 22a to 22c.

In the plasma processing apparatus 1, the processing gas supplied to the gas diffusion chamber 22a is supplied to a central region of the substrate W from the plurality of gas holes 22h connected to the gas diffusion chamber 22a. The processing gas supplied to the gas diffusion chamber 22b is supplied to an edge region of the substrate W from the plurality of gas holes 22h connected to the gas diffusion chamber 22b. The processing gas supplied to the gas diffusion chamber 22c is supplied to a region outside an edge of the substrate W in the radial direction from the plurality of gas holes 22h connected to the gas diffusion chamber 22c. The gas supply 24 can adjust the distribution of the flow rate of the processing gas along the radial direction of the substrate W by using the flow splitter 24d to adjust the distribution ratio of the processing gas to the plurality of gas diffusion chambers 22a to 22c.

The plasma processing apparatus 1 further includes a radio frequency power source 26. The radio frequency power source 26 configures the plasma generator according to one embodiment. The radio frequency power source 26 is connected to a radio frequency electrode via a matcher 26m. The radio frequency power source 26 generates radio frequency power that is supplied to the radio frequency electrode. The radio frequency electrode may be an electrode in the substrate support 16. In one embodiment, the radio frequency electrode is the base 18. The radio frequency power generated by the radio frequency power source 26 has a frequency suitable for the generation of plasma. The frequency is, for example, 100 MHz. The matcher 26m has a matching circuit for matching an impedance of a load of the radio frequency power source 26 with an output impedance of the radio frequency power source 26. It should be noted that the radio frequency power source 26 may be connected to the upper electrode 22. That is, the upper electrode 22 may be a radio frequency electrode.

The plasma processing apparatus 1 may further include a bias power source 28. The bias power source 28 is connected to a bias electrode of the substrate support 16 via a matcher 28m. The bias power source 28 generates bias energy that is supplied to the bias electrode. The bias energy is supplied to the electrode of the substrate support 16 to draw ions into the substrate W. In one embodiment, the bias electrode is the base 18. The bias energy that is generated by the bias power source 28 is radio frequency bias power or a pulse of a voltage that is intermittently or periodically generated. The matcher 28m has a matching circuit for matching an impedance of a load of the bias power source 28 with an output impedance of the bias power source 28.

In the plasma processing apparatus 1, the processing gas is supplied from the gas supply 24 into the chamber 10. In addition, the pressure in the chamber 10 is reduced by the exhaust device 14. In addition, the radio frequency power is supplied from the radio frequency power source 26 to the radio frequency electrode. As a result, plasma is generated from the processing gas in the chamber 10. Then, the substrate W is processed by chemical species such as radicals and ions from the plasma. For example, a film of the substrate W is etched. Energy of the ions supplied to the substrate W can be adjusted by the bias energy from the bias power source 28.

Figure 4:
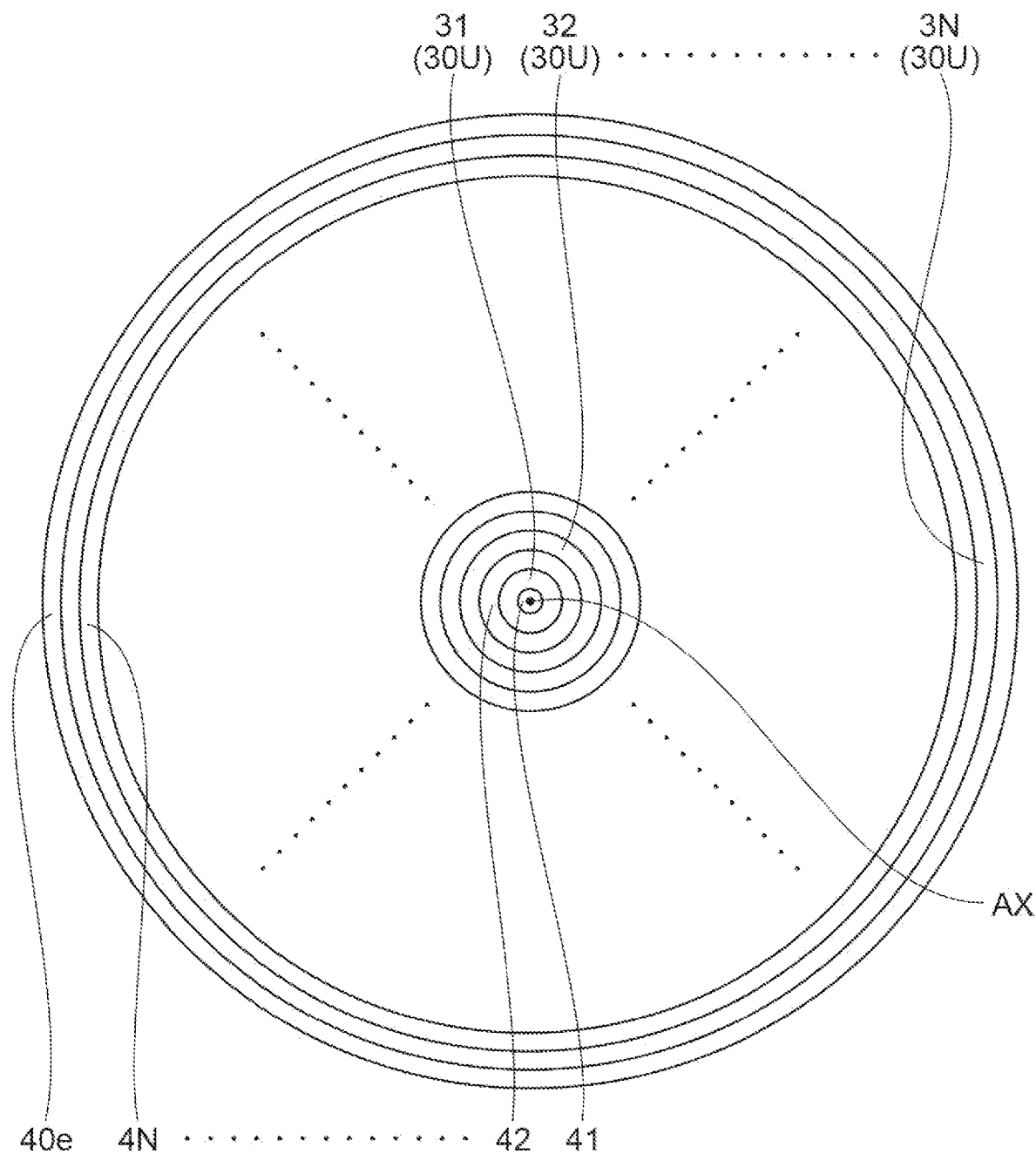
FIG. 4 is a plan view showing an arrangement of a plurality of electromagnets in the plasma processing apparatus according to one exemplary embodiment.

Hereinafter, the description will be made with reference to FIG. 4 together with FIG. 2. FIG. 4 is a plan view showing arrangement of a plurality of electromagnets in the plasma processing apparatus according to one exemplary embodiment. The plasma processing apparatus 1 further includes a plurality of electromagnets 30. The plurality of electromagnets 30 are disposed on a ceiling portion (upper electrode 22) of the chamber 10. The plurality of electromagnets 30 include electromagnets 31 to 3N. Each of the plurality of electromagnets 30 is configured of a coil wound around the axis AX. The plurality of electromagnets 30 have inner diameters different from each other and are disposed concentrically. Some of the plurality of electromagnets 30 are disposed above the substrate W. One or more of the plurality of electromagnets 30 may be disposed above a region outside the edge of the substrate W. The plurality of electromagnets 30 configures a plurality of annular electromagnet units 30U. The plurality of annular electromagnet units 30U are disposed coaxially with respect to the axis AX. Each of the plurality of annular electromagnet units 30U includes at least one corresponding electromagnet 30 among the plurality of electromagnets 30.

The plasma processing apparatus 1 may further include a bobbin member 40. The bobbin member 40 may be formed of a magnetic material. The bobbin member 40 includes bobbins 41 to 4N. The coils of the electromagnets 31 to 3N are respectively wound around the bobbins 41 to 4N. The bobbins 41 to 4N are provided concentrically, and a central axis thereof is the axis AX. The bobbin 41 has a columnar shape. The bobbins 42 to 4N have a cylindrical shape and are provided outside the bobbin 41 in the radial direction. The bobbin member 40 may further include a tubular portion 40e and a base portion 40b. The tubular portion 40e is provided concentrically with the bobbins 41 to 4N, and surrounds the electromagnet 3N on the outside of the bobbin 4N in the radial direction. The base portion 40b has a substantially disk shape. The bobbins 41 to 4N and the tubular portion 40e are integrated with the base portion 40b and extend downward from the base portion 40b.

The plasma processing apparatus 1 further includes at least one power source 50. The power source 50 is configured to individually supply a current to the coils of the plurality of electromagnets 30 (or the plurality of annular electromagnet units 30U). The current that is supplied from the power source 50 to the coils of the plurality of electromagnets 30 (or the plurality of annular electromagnet units 30U) is, for example, a DC current. The current that is supplied to the coils of the plurality of electromagnets 30 (or the plurality of annular electromagnet units 30U) by the power source 50 is individually controlled by a controller Cnt described below.

The plurality of electromagnets 30 generate magnetic fields that are axially symmetrical with respect to the axis AX in the chamber 10, respectively. In addition, a synthetic magnetic field is generated in the chamber 10 by the magnetic fields respectively generated by the plurality of electromagnets 30. This synthetic magnetic field is also axially symmetrical with respect to the axis AX. In addition, by controlling the currents respectively supplied to the plurality of electromagnets 30 (or the plurality of annular electromagnet units 30U), it is possible to adjust a magnetic field intensity distribution along the radial direction with respect to the axis AX. As a result, the plasma processing apparatus 1 can adjust a distribution of a density of the plasma in the chamber 10 along the radial direction of the substrate W.

The plasma processing apparatus 1 further includes one or more sensors 60. The one or more sensors 60 are configured to acquire a plasma state, that is, a state of plasma in the chamber 10. Each of the one or more sensors 60 is an optical sensor. The one or more sensors 60 detect the emission intensity distribution of the plasma in the chamber 10 along the radial direction with respect to the axis AX. The one or more sensors 60 may include a plurality of sensors 60 disposed above the internal space 10s. The plurality of sensors 60 may be disposed in the upper electrode 22. The plurality of sensors 60 detect the emission intensity distribution of the plasma in the chamber 10 along the radial direction via the plurality of gas holes 22h. Instead of the plurality of sensors 60 or in addition to the plurality of sensors 60, the one or more sensors 60 may include at least one sensor 60. The at least one sensor 60 is disposed along the side wall of the chamber 10, and detects the emission intensity distribution of the plasma in the chamber 10 along the radial direction via an optical window provided on the side wall of the chamber 10.

In one embodiment, the plasma processing apparatus 1 may further include a shape measuring device 70 or a shape measuring device including a transmitter 70t and a receiver 70r. The shape measuring device 70 is a sensor configured to measure a shape of the substrate W (for example, an in-plane distribution of widths of openings of a mask) when the substrate W enters the internal space 10s from the passage 10p. The transmitter 70t transmits measurement light to the substrate W placed on the substrate support 16 via the optical window. The receiver 70r receives reflected light from the substrate W to measure the shape of the substrate W (for example, the in-plane distribution of the widths of the openings of the mask). The shape measuring device may be disposed above the internal space 10s in a case where a ceiling plate of the chamber 10 defining the internal space 10s is formed of an optically transparent material. Alternatively, the one or more sensors 60 may also serve as a shape measuring device.

The plasma processing apparatus 1 further includes a controller Cnt. The controller Cnt is a computer which includes a processor, a storage device, an input device, a display device, and the like, and controls each part of the plasma processing apparatus 1. Specifically, the controller Cnt executes a control program stored in the storage device, and controls each part of the plasma processing apparatus 1 based on recipe data stored in the storage device. A process designated by the recipe data is performed in the plasma processing apparatus 1 under the control by the controller Cnt. In addition, as will be described below, the controller Cnt controls the power source 50 to adjust the currents respectively supplied to the plurality of electromagnets 30 (or the plurality of annular electromagnet units 30U) based on the plasma state (for example, the emission intensity distribution of the plasma).

Figure 5:
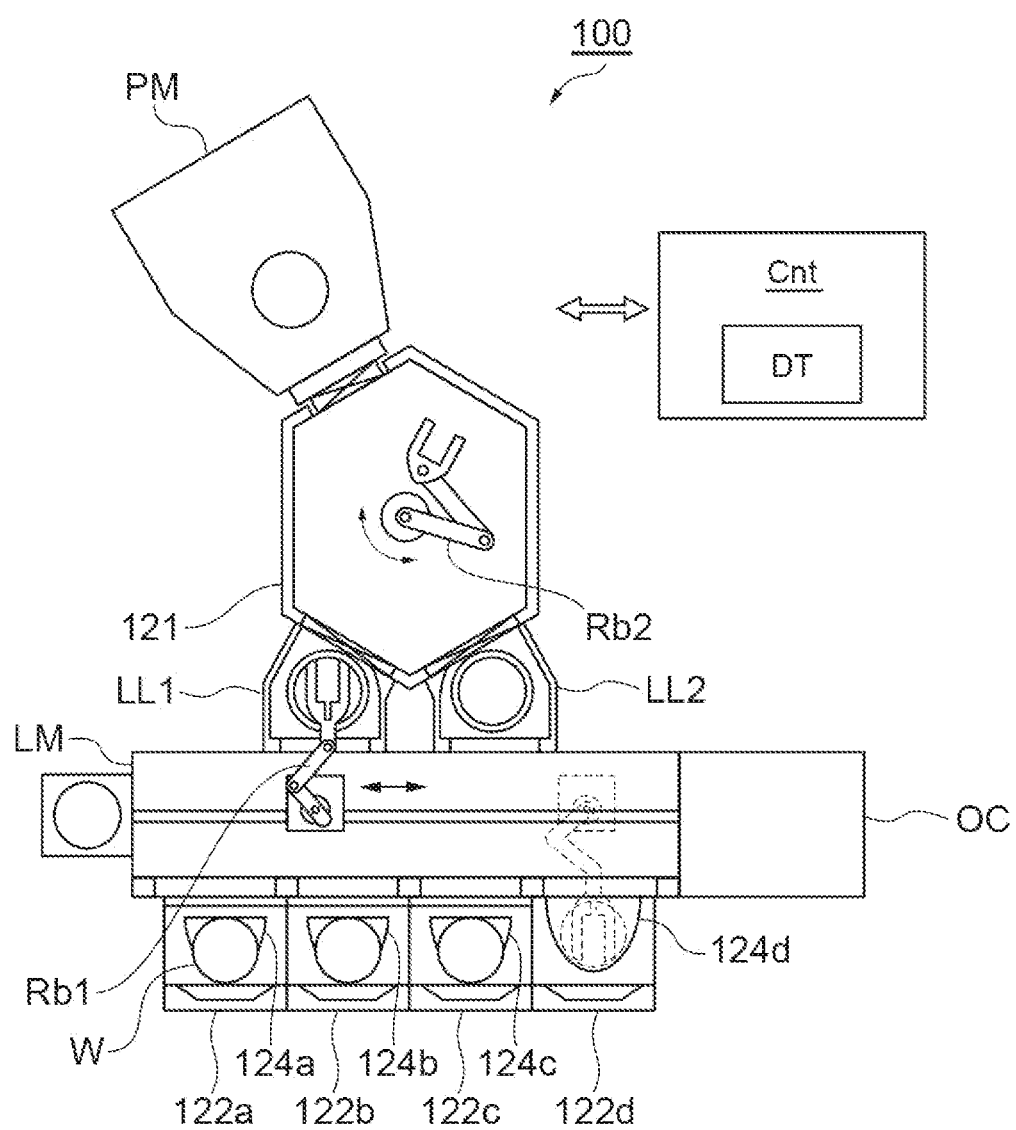
FIG. 5 is a diagram showing a substrate processing system according to one exemplary embodiment.

In one embodiment, the plasma processing apparatus 1 may configure a part of a substrate processing system. FIG. 5 is a diagram showing a substrate processing system according to one exemplary embodiment. The substrate processing system (hereinafter, referred to as a "system 100") shown in FIG. 5 may be used in the method MT. The system 100 includes tables 122a to 122d, containers 124a to 124d, a loader module LM, load lock modules LL1 and LL2, a transfer module 121, and a process module PM.

The tables 122a to 122d are arranged along one edge of the loader module LM. The containers 124a to 124d are provided on the tables 122a to 122d, respectively. The substrate W can be accommodated in each of the containers 124a to 124d. Each of the containers 124a to 124d is, for example, a container called a front-opening unified pod (FOUP).

The loader module LM has a chamber. The pressure in the chamber of the loader module LM is set to atmospheric pressure. A transfer robot Rb1 is disposed in the chamber of the loader module LM. The transfer robot Rb1 is configured to transfer the substrate W between any of the containers 124a to 124d and any of the load lock modules LL1 and LL2. In addition, the transfer robot Rb1 is configured to transfer the substrate W between any of the load lock modules LL1 and LL2 and an optical observation device OC, or between the optical observation device OC and any of the containers 124a to 124d.

The load lock modules LL1 and LL2 are connected to the loader module LM. A preliminary decompression chamber is provided in each of the load lock modules LL1 and LL2. The load lock modules LL1 and LL2 are connected to the transfer module 121.

The transfer module 121 has a chamber capable of being decompressed. A transfer robot Rb2 is provided in the chamber of the transfer module 121. The process module PM is connected to the transfer module 121. The transfer robot Rb2 is configured to transfer the substrate W between any of the load lock modules LL1 and LL2 and the process module PM. The process module PM is the plasma processing apparatus 1.

The system 100 further includes an optical observation device OC (shape measuring device). The substrate W is transferred between the optical observation device OC and the process module PM by the transfer robot Rb1 and the transfer robot Rb2. The optical observation device OC performs positioning of the substrate W housed therein. Thereafter, the optical observation device OC measures the shape of the substrate W. For example, the optical observation device OC measures an in-plane distribution in the substrate W of widths of a plurality of openings formed on the substrate W by the process module PM (plasma processing apparatus 1). In addition, the optical observation device OC may measure the shape of the substrate W (for example, the in-plane distribution of the widths of the openings of the mask) before being processed by the process module PM (plasma processing apparatus 1).

The controller Cnt described above controls each part of the system 100 in addition to each part of the plasma processing apparatus 1, that is, the process module PM. Data DT, which will be described below, is stored in the storage device of the controller Cnt in a readable manner.

With reference to FIG. 1 again, the method MT will be described by taking a case where the plasma processing apparatus 1 is used as an example. In the method MT, each part of the plasma processing apparatus 1 and each part of the system 100 may be controlled by the controller Cnt.

In one embodiment, the method MT may include Step ST1 to Step ST4. In Step ST1, the sensor substrate is transferred into the chamber 10. The sensor substrate may be transferred into the chamber 10 by the transfer robot Rb2. The sensor substrate is a substrate having substantially the same shape as the substrate W, and has a plurality of sensors arranged along the radial direction thereof. In one embodiment, each of the plurality of sensors of the sensor substrate is configured to acquire flux of ions or radicals. In this embodiment, the sensor substrate measures a flux distribution of ions or radicals supplied to the sensor substrate as the plasma state.

In subsequent Step ST2, plasma is generated in the chamber 10. In Step ST2, a processing gas or another gas is supplied from the gas supply 24 into the chamber 10. In addition, the pressure in the chamber 10 is adjusted by the exhaust device 14 to a designated pressure. In addition, the radio frequency power is supplied from the radio frequency power source 26. In Step ST2, the bias energy may be supplied from the bias power source 28. In Step ST2, the gas supply 24, the exhaust device 14, the radio frequency power source 26, and the bias power source 28 are controlled by the controller Cnt in order to generate plasma.

In subsequent Step ST3, a plasma state of the plasma generated in step ST2 is acquired by the sensor substrate. The plasma state may be the flux distribution of ions or radicals supplied to the sensor substrate as described above.

In subsequent Step ST4, the currents respectively supplied from the power source 50 to the plurality of electromagnets 30 (or the plurality of annular electromagnet units 30U) are adjusted based on the plasma state acquired using the sensor substrate. The currents respectively supplied from the power source 50 to the plurality of electromagnets 30 (or the plurality of annular electromagnet units 30U) are controlled by the controller Cnt. The currents respectively supplied to the plurality of electromagnets 30 (or the plurality of annular electromagnet units 30U) are adjusted to reduce a difference between the plasma state acquired using the sensor substrate and a desired plasma state. The desired plasma state is given to the controller Cnt of the plasma processing apparatus 1 as input data. The respective currents to the plurality of electromagnets 30 (or the plurality of annular electromagnet units 30U) adjusted in Step ST4 can be initially used in Step ST12 described below. The controller Cnt can identify the respective currents to the plurality of electromagnets 30 (or the plurality of annular electromagnet units 30U) by using a table or function which specifies the respective currents to the plurality of electromagnets 30 (or the plurality of annular electromagnet units 30U) from the plasma state acquired using the sensor substrate and the desired plasma state. This table or function is prepared in advance.

As shown in FIG. 1, the method MT includes Step ST11 and Step ST14. In one embodiment, Step ST11 to Step ST14 are performed after the sensor substrate is transferred out from the chamber 10.

In Step ST11, the substrate W is transferred into the chamber 10. The substrate W is a substrate to be processed in Step ST12. The substrate W is accommodated in any of the containers 124a to 124d before Step ST11. The substrate W may be transferred into the chamber 10 by the transfer robot Rb2.

In subsequent Step ST12, plasma is generated in the chamber 10 and the substrate W is processed by the plasma. For example, the substrate W is etched. In Step ST12, the processing gas is supplied from the gas supply 24 into the chamber 10. In addition, the pressure in the chamber 10 is adjusted by the exhaust device 14 to a designated pressure. In addition, the radio frequency power is supplied from the radio frequency power source 26. In Step ST12, the bias energy may be supplied from the bias power source 28. In Step ST12, the gas supply 24, the exhaust device 14, the radio frequency power source 26, and the bias power source 28 are controlled by the controller Cnt in order to generate plasma.

Step ST13 is performed when the substrate W is being processed by the plasma in Step ST12. In Step ST13, a state of the plasma generated in the chamber 10 in Step ST12, that is, a plasma state is acquired by using the one or more sensors 60. The plasma state acquired in Step ST13 may be an emission intensity distribution of plasma acquired by using the one or more sensors 60. Alternatively, the plasma state acquired in Step ST13 may be a distribution of a density or an amount of chemical species (for example, radicals and/or ions) in the plasma obtained from the emission intensity distribution acquired by using the one or more sensors 60. The distribution of the density or the amount of chemical species in the plasma is obtained from the emission intensity distribution by an actinometry method.

Step ST14 is performed after the processing on the substrate W in Step ST12 is completed. In Step ST14, the substrate W is transferred out from the chamber 10. The substrate W may be transferred out from the chamber 10 by the transfer robot Rb2. The substrate W transferred out from the chamber 10 may be accommodated in any of the containers 124a to 124d.

The method MT further includes Step STC. Step STC is performed when Step ST12 is being performed or after Step ST12 (for example, after Step ST15 described below). In Step STC, the currents respectively supplied from the power source 50 to the plurality of electromagnets 30 (or the plurality of annular electromagnet units 30U) are adjusted based on the plasma state acquired in Step ST13. In Step STC, the temperature distribution of the substrate W may be further adjusted by the temperature control mechanism of the substrate support 16. In Step STC, the distribution of the flow rate of the processing gas along the radial direction of the substrate W may be further adjusted by the gas supply 24. In Step STC, the power source 50, the temperature control mechanism of the substrate support 16, and the gas supply 24 are controlled by the controller Cnt.

In one embodiment, the currents respectively supplied to the plurality of electromagnets 30 (or the plurality of annular electromagnet units 30U) are adjusted to reduce a difference between the plasma state acquired in Step ST13 and a desired plasma state. The desired plasma state is given to the controller Cnt of the plasma processing apparatus 1 as input data. The controller Cnt can identify the respective currents to the plurality of electromagnets 30 (or the plurality of annular electromagnet units 30U) by using a table or function which specifies the respective currents to the plurality of electromagnets 30 (or the plurality of annular electromagnet units 30U) from the plasma state acquired in Step ST13 and the desired plasma state. This table or function is prepared in advance.

Alternatively, in Step STC, the shape of the substrate W corresponding to the plasma state acquired in Step ST13 may be identified from the data DT prepared in advance. The shape of the substrate W is, for example, an in-plane distribution in the substrate W of widths of a plurality of openings formed on the substrate W by the plasma. The data DT indicates a relationship between a plurality of plasma states and shapes of the substrate respectively obtained in the plurality of plasma states. The currents respectively supplied from the power source 50 to the plurality of electromagnets 30 (or the plurality of annular electromagnet units 30U) may be adjusted in Step STC to reduce a difference between the shape of the substrate W identified by referring to the data DT from the plasma state acquired in Step ST13, and a desired shape of the substrate. The desired shape of the substrate is given to the controller Cnt of the plasma processing apparatus 1 as input data. The controller Cnt can identify the respective currents to the plurality of electromagnets 30 (or the plurality of annular electromagnet units 30U) by using a table or function which specifies the respective currents to the plurality of electromagnets 30 (or the plurality of annular electromagnet units 30U) from the acquired shape of the substrate W and a desired shape of the substrate W. This table or function is prepared in advance.

The method MT further includes Step STJ. In Step STJ, it is determined whether or not a stop condition is satisfied. The stop condition is satisfied in a case where another substrate W to be processed does not exist. In a case where the stop condition is not satisfied, the processes from Step ST11 are performed on the other substrate W. On the other hand, in a case where the stop condition is satisfied, the method MT ends.

The method MT may further include Step ST15. Step ST15 is performed after Step ST12. In one embodiment, Step ST15 is performed after Step ST14. In Step ST15, the shape of the substrate W processed in Step ST12 is measured. The shape of the substrate W is, for example, an in-plane distribution in the substrate W of widths of a plurality of openings formed on the substrate W by the plasma. The shape of the substrate W may be measured in the optical observation device OC. Alternatively, the shape of the substrate W may be measured using an imaging device such as a hyperspectral camera disposed in the plasma processing apparatus 1.

In one embodiment, Step STC may be performed after Step ST15. In this case, the currents respectively supplied from the power source 50 to the plurality of electromagnets 30 (or the plurality of annular electromagnet units 30U) are adjusted for the substrate W to be processed next. The currents respectively supplied from the power source 50 to the plurality of electromagnets 30 (or the plurality of annular electromagnet units 30U) are adjusted to reduce a difference between the plasma state acquired in Step ST13 and a desired plasma state and to reduce a difference between the measured shape of the substrate W and a desired shape of the substrate. The desired plasma state and the desired shape of the substrate are given to the controller Cnt of the plasma processing apparatus 1 as input data. The controller Cnt can identify the respective currents to the plurality of electromagnets 30 (or the plurality of annular electromagnet units 30U) by using a table or function which specified the respective currents to the plurality of electromagnets 30 (or the plurality of annular electromagnet units 30U) from the state of plasma acquired in Step ST13 and the desired state of plasma and the shape of the substrate W measured in Step ST15 and the desired shape of the substrate W. This table or function is prepared in advance.

According to the method MT, the plasma state (for example, the emission intensity distribution of the plasma) is acquired. Then, the currents respectively supplied to the plurality of electromagnets 30 (or the plurality of annular electromagnet units 30U) are adjusted based on the acquired plasma state. As a result, the distribution of the density of the plasma is adjusted based on the plasma state. The plasma state is acquired, for example, when the substrate W is being processed by the plasma. Therefore, the distribution of the density of the plasma can be adjusted based on the plasma state when the substrate W is actually being processed.

Figure 6A:
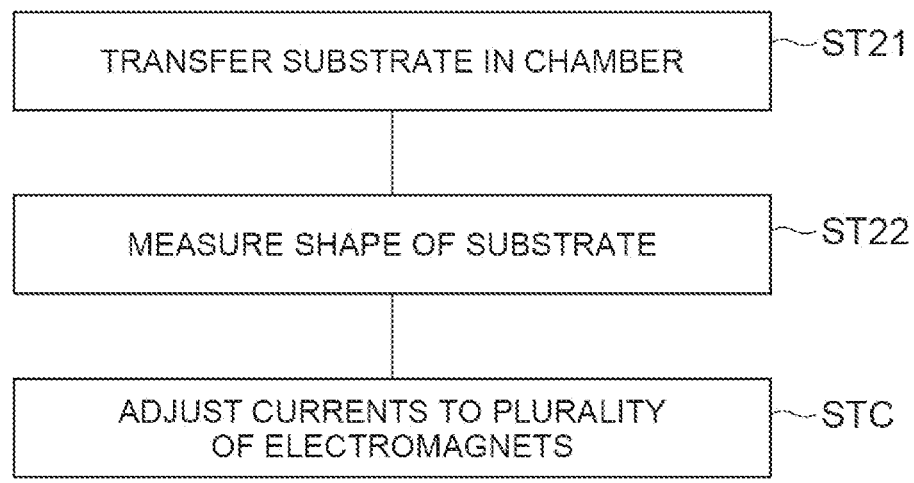
FIG. 6B is a flowchart of a part of processing that can be adopted in the plasma processing method according to one exemplary embodiment.
Figure 6B:
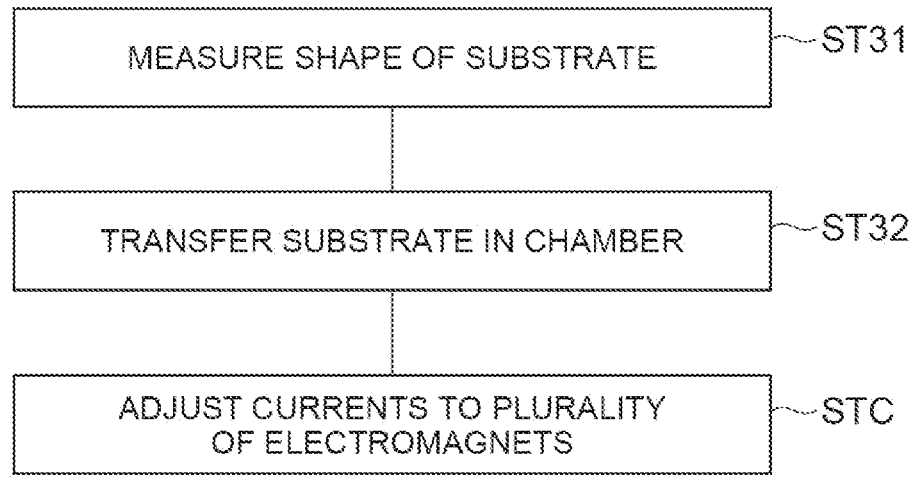

Hereinafter, the description will be made with reference to FIG. 6A and FIG. 6B. Each of FIG. 6A and FIG. 6B is a flowchart of a part of processing that can be adopted in the plasma processing method according to one exemplary embodiment. The process shown in each of FIG. 6A and FIG. 6B can be adopted in the method MT instead of Step ST11.

The process shown in FIG. 6A includes Step ST21, Step ST22, and Step STC. In Step ST21, the substrate W is transferred into the chamber 10. In Step ST22, the shape of the substrate W (for example, the in-plane distribution of the widths of the openings of the mask) is measured in the chamber 10. The shape of the substrate W is measured using the above-described shape measuring device such as the shape measuring device 70 and/or the shape measuring device including the transmitter 70t and the receiver 70r.

In Step STC shown in FIG. 6A, the currents respectively supplied from the power source 50 to the plurality of electromagnets 30 (or the plurality of annular electromagnet units 30U) are adjusted. The currents respectively supplied from the power source 50 to the plurality of electromagnets 30 (or the plurality of annular electromagnet units 30U) are adjusted such that a substrate having a desired shape is obtained from the substrate W having the shape acquired in Step ST22 after the process in Step ST12. The desired shape of the substrate after the process in Step ST12 is given to the controller Cnt of the plasma processing apparatus 1 as input data. The controller Cnt can identify the respective currents to the plurality of electromagnets 30 (or the plurality of annular electromagnet units 30U) by using a table or function which specifies the respective currents to be respectively supplied to the plurality of electromagnets 30 (or the plurality of annular electromagnet units 30U) to obtain a substrate having a desired shape by the process in Step ST12 from the substrate W having the shape measured in Step ST22. This table or function is prepared in advance.

The process shown in FIG. 6B includes Step ST31, Step ST32, and Step STC. In Step ST31, the shape of the substrate W (for example, the in-plane distribution of the widths of the openings of the mask) is measured outside the chamber 10. The shape of the substrate W is measured using, for example, the optical observation device OC. In subsequent Step ST32, the substrate W is transferred into the chamber 10.

In Step STC shown FIG. 6B, the currents respectively supplied from the power source 50 to the plurality of electromagnets 30 (or the plurality of annular electromagnet units 30U) are adjusted. The currents respectively supplied from the power source 50 to the plurality of electromagnets 30 (or the plurality of annular electromagnet units 30U) are adjusted such that a substrate having a desired shape is obtained from the substrate W having the shape acquired in Step ST31 after the process in Step ST12. The desired shape of the substrate after the process in Step ST12 is given to the controller Cnt of the plasma processing apparatus 1 as input data. The controller Cnt can identify the respective currents to the plurality of electromagnets 30 (or the plurality of annular electromagnet units 30U) by using a table or function which specifies the currents to be respectively supplied to the plurality of electromagnets 30 (or the plurality of annular electromagnet units 30U) to obtain a substrate having a desired shape by the process in Step ST12 from the substrate W having the shape measured in Step ST31. This table or function is prepared in advance.

Figure 7:
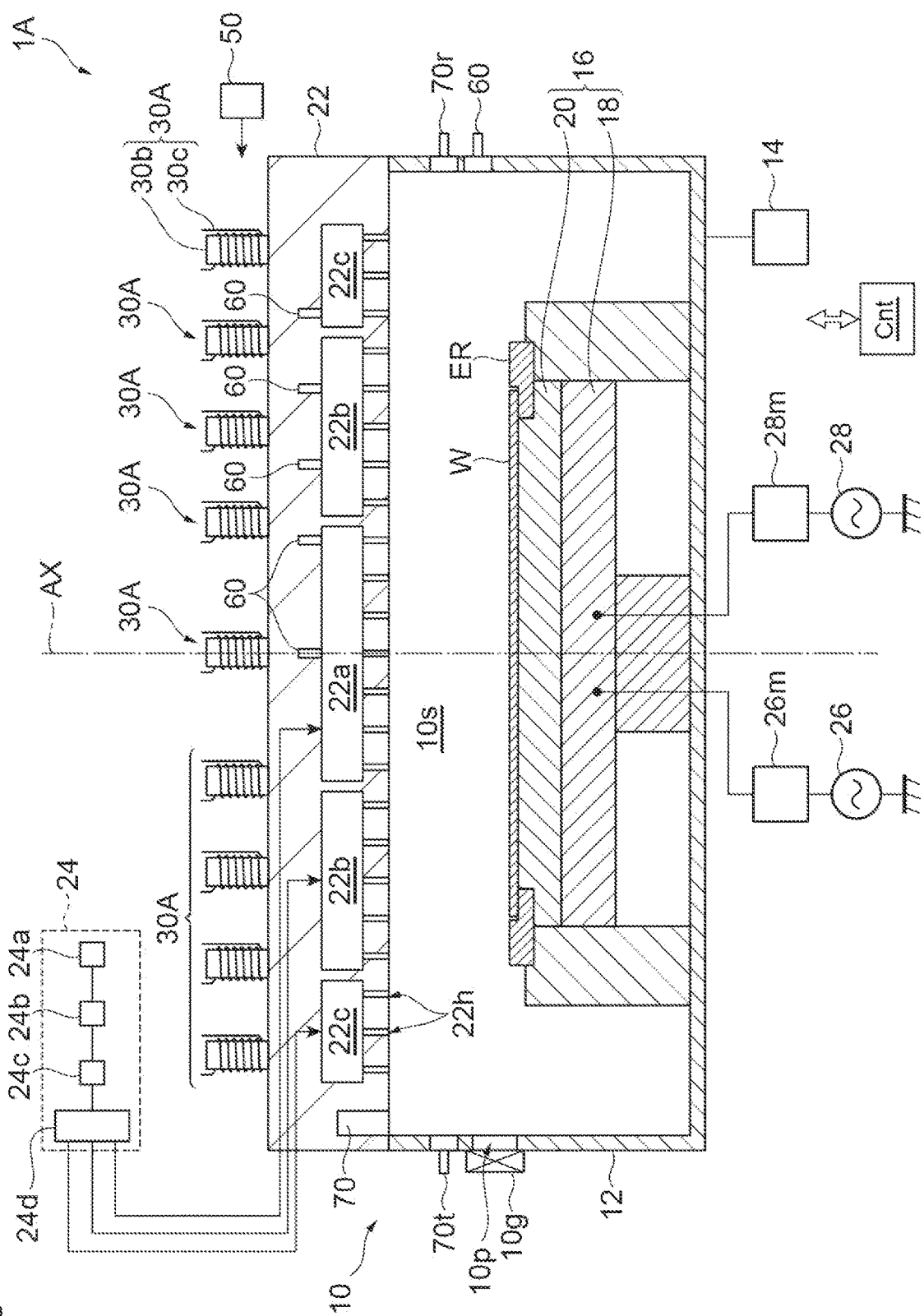
FIG. 7 is a diagram showing a plasma processing apparatus according to another exemplary embodiment.
Figure 8:
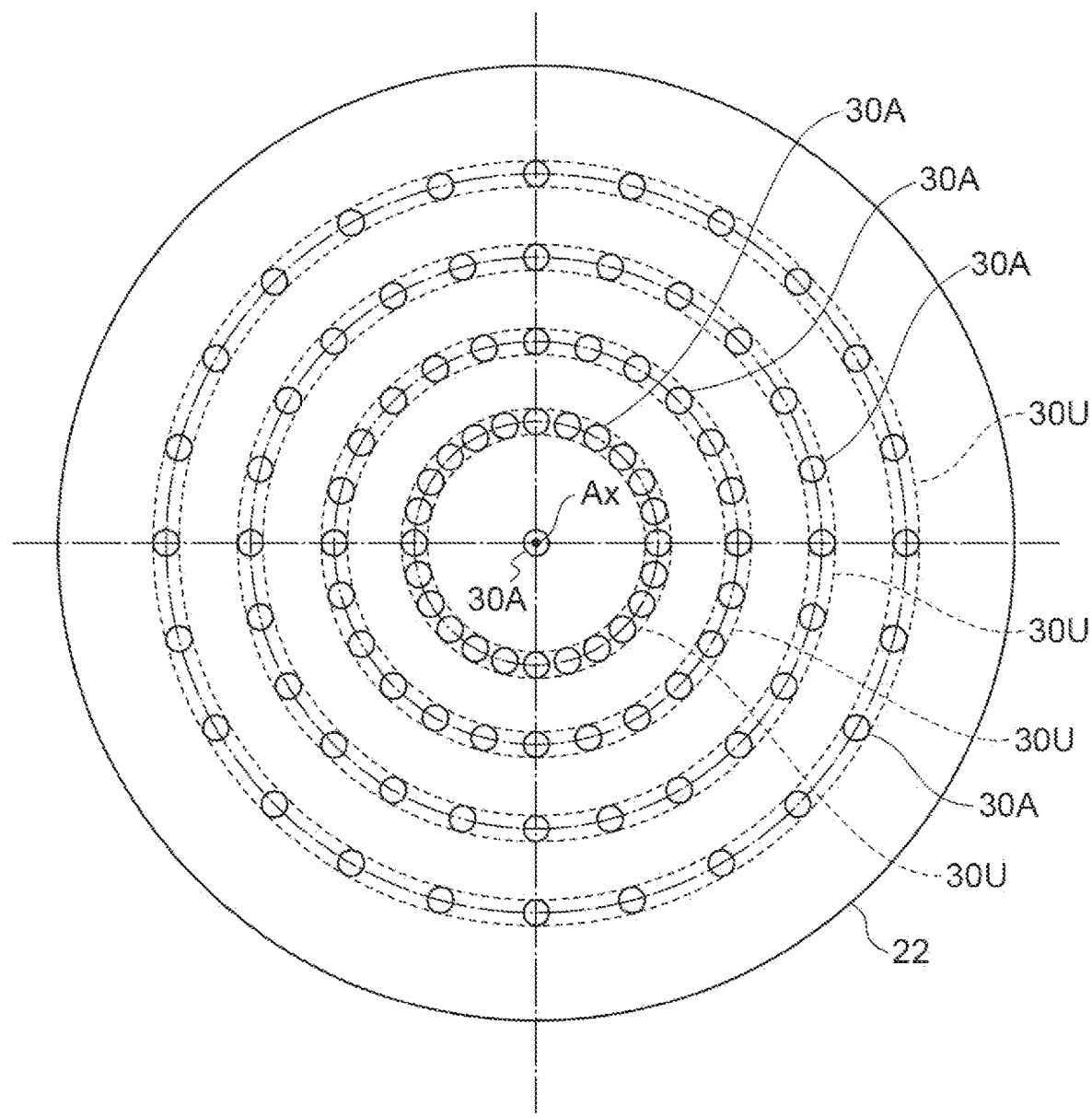
FIG. 8 is a plan view showing an arrangement of a plurality of electromagnets in the plasma processing apparatus according to another exemplary embodiment.

Hereinafter, the description will be made with reference to FIGS. 7 and 8. FIG. 7 is a diagram showing a plasma processing apparatus according to another exemplary embodiment. FIG. 8 is a plan view showing an arrangement of a plurality of electromagnets in the plasma processing apparatus according to another exemplary embodiment. A plasma processing apparatus 1A shown in FIGS. 7 and 8 may be used in the method MT. The plasma processing apparatus 1A is different from the plasma processing apparatus 1 in that a plurality of electromagnets 30A are provided instead of the plurality of electromagnets 30. Other configurations of the plasma processing apparatus 1A are the same as the corresponding configurations of the plasma processing apparatus 1.

The plurality of electromagnets 30A are provided on the ceiling portion (upper electrode 22) of the chamber 10. The plurality of electromagnets 30A are arranged along a plurality of concentric circles around the axis AX and in a radiation direction (radial direction) with respect to the axis AX. One of the plurality of electromagnets 30A may be disposed on the axis AX. The plurality of electromagnets 30A configures a plurality of annular electromagnet units 30U. Each of the plurality of annular electromagnet units 30U is configured of the plurality of electromagnets 30A arranged along one corresponding concentric circle among the plurality of concentric circles.

Each of the plurality of electromagnets 30A includes a bobbin 30b and a coil 30c. The bobbin 30b has a columnar shape and extends in the vertical direction. The bobbin 30b is formed of, for example, a magnetic material. The coil 30c is wound around the bobbin 30b. That is, the coil 30c is provided around an axis extending in the vertical direction.

The current from the power source 50 is individually supplied to the coil 30c of each of the plurality of electromagnets 30A (or the plurality of annular electromagnet units 30U). The current supplied to the coil 30c of each of the plurality of electromagnets 30A (or the plurality of annular electromagnet units 30U) can be controlled by the controller Cnt. In the plasma processing apparatus 1A, currents of the same direction and the same value are supplied to the coils 30c of the electromagnets 30A arranged along the same circle among the plurality of concentric circles.

In the plasma processing apparatus 1A, a synthetic magnetic field that is axially symmetric with respect to the axis AX is generated in the chamber 10 by the plurality of electromagnets 30A. In addition, by controlling the respective currents supplied to the plurality of electromagnets 30A (or the plurality of annular electromagnet units 30U), it is possible to adjust a magnetic field intensity distribution along the radial direction with respect to the axis AX. As a result, the plasma processing apparatus 1 can adjust a distribution of a density of the plasma in the chamber 10 along the radial direction of the substrate W.

While various exemplary embodiments have been described above, various additions, omissions, substitutions and changes may be made without being limited to the exemplary embodiments described above. Elements of the different embodiments may be combined to form another embodiment.

For example, in each of the plasma processing apparatuses 1 and 1A, the plurality of electromagnets and the plurality of annular electromagnet units may be provided in the ceiling portion (upper electrode 22) of the chamber 10.

In another embodiment, the plasma processing apparatus may be a plasma processing apparatus of a type other than the capacitively coupled type. The plasma processing apparatus according to another embodiment may be another type of plasma processing apparatus such as an inductively coupled plasma processing apparatus or an electron cyclotron resonance (ECR) plasma processing apparatus.

In addition, the present disclosure also includes the following other Embodiments E1 to E10.

[E1] A plasma processing method using a plasma processing apparatus, the plasma processing apparatus including:
 a chamber;
 a substrate support disposed in the chamber;
 a gas supply configured to supply processing gas into the chamber;
 a plasma generator configured to generate plasma from the processing gas in the chamber;
 a plurality of electromagnets disposed on a ceiling portion of the chamber and configured of a plurality of coils provided coaxially with respect to a central axis passing through a center of the substrate support in a vertical direction, or a plurality of electromagnets disposed on the ceiling portion and arranged along a plurality of concentric circles around the central axis and along a radiation direction, each of the plurality of electromagnets having a coil provided around an axis extending in the vertical direction; and a power source configured to supply currents to the plurality of electromagnets, the plasma processing method including:

(a) transferring a substrate into the chamber;
(b) processing the substrate by the plasma generated in the chamber;
(c) acquiring a plasma state by using one or more sensors when the substrate is being processed by the plasma; and
(d) transferring the substrate out from the chamber after the processing of the substrate, wherein the (a) to the (d) are sequentially performed on a plurality of the substrates, and the plasma processing method further includes (e) adjusting currents respectively supplied from the power source to the plurality of electromagnets based on the plasma state when the (b) is being performed or after the (b).

[E2] The plasma processing method according to Embodiment E1, wherein the plasma state is an emission intensity distribution of the plasma, or a distribution of a density or an amount of chemical species in the plasma obtained from the emission intensity distribution.

[E3] The plasma processing method according to Embodiment E1 or E2, further including:

measuring a plasma state generated in the chamber using a sensor substrate placed on the substrate support, before the (a); and adjusting the currents respectively supplied from the power source to the plurality of electromagnets based on the plasma state measured using the sensor substrate.

[E4] The plasma processing method according to Embodiment E3, wherein the sensor substrate is configured to measure a flux distribution of ions or radicals supplied to the sensor substrate as the plasma state.

[E5] The plasma processing method according to any one of Embodiments E1 to E4, wherein, in the (e), the currents respectively supplied from the power source to the plurality of electromagnets are adjusted to reduce a difference between the plasma state acquired by using the one or more sensors and a desired plasma state.

[E6] The plasma processing method according to any one of Embodiments E1 to E4, wherein a shape of a substrate corresponding to a plasma state acquired by using the one or more sensors is identified from data prepared in advance which indicates a relationship between a plurality of plasma states and shapes of the substrate obtained in the plurality of plasma states, and in the (e), the currents respectively supplied from the power source to the plurality of electromagnets are adjusted to reduce a difference between the identified shape of the substrate and a desired shape of the substrate.

[E7] The plasma processing method according to any one of Embodiments E1 to E4, wherein a shape of the substrate processed in the (b) is measured, and in the (e), the currents respectively supplied from the power source to the plurality of electromagnets are adjusted to reduce a difference between the plasma state acquired by the one or more sensors and a desired plasma state and to reduce a difference between the measured shape of the substrate and a desired shape of the substrate.

[E8] The plasma processing method according to any one of Embodiments E1 to E7, wherein the substrate support includes a temperature control mechanism configured to be capable of adjusting a temperature distribution of the substrate, and in the (e), the temperature control mechanism is controlled to adjust the temperature distribution of the substrate.

[E9] The plasma processing method according to any one of Embodiments E1 to E8, in which the gas supply is configured to be capable of adjusting a distribution of a flow rate of the processing gas supplied to the substrate along the radial direction of the substrate, and in the (e), the gas supply is controlled to adjust the distribution of the flow rate of the processing gas along the radial direction of the substrate.

[E10] A plasma processing apparatus including:

a chamber;
a substrate support disposed in the chamber;
a gas supply configured to supply processing gas into the chamber;
a plasma generator configured to generate plasma from the processing gas in the chamber;
a plurality of electromagnets disposed on a ceiling portion of the chamber and configured of a plurality of coils provided coaxially with respect to a central axis passing through a center of the substrate support in a vertical direction, or a plurality of electromagnets disposed on the ceiling portion and arranged along a plurality of concentric circles around the central axis and along a radiation direction, each of the plurality of electromagnets having a coil provided around an axis extending in the vertical direction;
a power source configured to supply currents to the plurality of electromagnets; and
a controller configured to control the plasma generator and the power source,
wherein the controller
controls the plasma generator to generate plasma from the processing gas in the chamber to process the substrate, and
controls the power source to adjust the currents respectively supplied to the plurality of electromagnets based on a plasma state acquired by using one or more sensors during processing of the substrate.

From the foregoing description, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting, with the true scope and spirit being indicated by the following claims.

What is claimed is:

1. A plasma processing apparatus comprising:
a chamber having an internal space;
a substrate support disposed in the internal space of the chamber;
a gas supply configured to supply a processing gas into the internal space of the chamber;
a plasma generator configured to generate plasma from the processing gas in the internal space of the chamber;

a plurality of annular electromagnet units disposed above the internal space of the chamber and disposed coaxially with respect to an axis passing through the internal space, each of the plurality of annular electromagnet units having one or more electromagnets;

at least one optical sensor configured to detect an emission intensity distribution of plasma in the internal space along a radial direction with respect to the axis;

at least one power source configured to individually supply a current to the plurality of annular electromagnet units; and a controller configured to adjust currents respectively supplied from the at least one power source to the plurality of annular electromagnet units based on the emission intensity distribution of the plasma detected by the at least one optical sensor.

2. The plasma processing apparatus according to claim 1, wherein each of the plurality of annular electromagnet units includes at least one annular electromagnet.

3. The plasma processing apparatus according to claim 1, wherein each of the plurality of annular electromagnet units includes a plurality of electromagnets arranged along a circumferential direction with respect to the axis.

4. The plasma processing apparatus according to claim 3, wherein each of the plurality of electromagnets includes a bobbin having a columnar shape and a coil wound around the bobbin.

5. The plasma processing apparatus according to claim 1, wherein the plasma processing apparatus includes a plurality of optical sensors disposed above the internal space and configured to detect the emission intensity distribution as the at least one optical sensor.

6. The plasma processing apparatus according to claim 5, wherein the plurality of optical sensors are arranged along the radial direction.

7. The plasma processing apparatus according to claim 1, wherein the at least one optical sensor is provided along a side wall of the chamber.

8. The plasma processing apparatus according to claim 1, wherein the controller is configured to adjust the current supplied to the plurality of annular electromagnet units to reduce a difference between the emission intensity distribution detected by the at least one optical sensor and a desired emission intensity distribution.

9. The plasma processing apparatus according to claim 1, wherein the substrate support includes a temperature control mechanism configured to adjust a temperature distribution of a substrate placed on the substrate support.

10. The plasma processing apparatus according to claim 1, wherein the gas supply is configured to adjust a distribution of a flow rate of the processing gas along the radial direction.

11. The plasma processing apparatus according to claim 1, wherein the controller is configured to adjust the currents respectively supplied from the at least one power source to the plurality of annular electromagnet units based on a shape of a substrate measured in the chamber or outside the chamber by a shape measuring device.

12. A plasma processing method using a plasma processing apparatus, the plasma processing apparatus including:
   a chamber having an internal space;
   a substrate support disposed in the internal space of the chamber;
   a gas supply configured to supply processing gas into the internal space of the chamber;
   a plasma generator configured to generate plasma from the processing gas in the internal space of the chamber;
   a plurality of annular electromagnet units disposed above the internal space of the chamber and disposed coaxially with respect to an axis passing through the internal space, each of the plurality of annular electromagnet units having one or more electromagnets;
   at least one optical sensor configured to detect an emission intensity distribution of plasma in the internal space along a radial direction with respect to the axis; and
   at least one power source configured to individually supply a current to the plurality of annular electromagnet units, the plasma processing method comprising:
   (a) detecting the emission intensity distribution of the plasma by the at least one optical sensor; and
   (b) adjusting the currents respectively supplied from the at least one power source to the plurality of annular electromagnet units based on the emission intensity distribution of the plasma.

13. The plasma processing method according to claim 12, wherein, in said (b), the currents respectively supplied to the plurality of annular electromagnet units are adjusted from a plasma state which is the emission intensity distribution of the plasma or a distribution of a density or an amount of chemical species in the plasma obtained from the emission intensity distribution.

14. The plasma processing method according to claim 12, further comprising:
   measuring a plasma state generated in the chamber using a sensor substrate placed on the substrate support; and
   adjusting the currents respectively supplied from the at least one power source to the plurality of annular electromagnet units based on the plasma state measured using the sensor substrate.

15. The plasma processing method according to claim 14, wherein the sensor substrate is configured to measure a flux distribution of ions or radicals supplied to the sensor substrate as the plasma state.

16. The plasma processing method according to claim 12, wherein a shape of a substrate corresponding to a plasma state based on the emission intensity distribution acquired by using the at least one optical sensor is identified from data prepared in advance which indicates a relationship between a plurality of plasma states and shapes of the substrate respectively obtained in the plurality of plasma states, and
   in said (b), the currents respectively supplied from the at least one power source to the plurality of annular electromagnet units are adjusted to reduce a difference between the identified shape of the substrate and a desired shape of the substrate.

17. The plasma processing method according to claim 12, further comprising:
   (c) processing a substrate by plasma generated in the chamber,
   wherein a shape of the substrate processed in said (c) is measured, and
   in said (b), the currents respectively supplied from the at least one power source to the plurality of annular electromagnet units are adjusted to reduce a difference between a plasma state based on the emission intensity distribution acquired by the at least one optical sensor and a desired plasma state and to reduce a difference between the measured shape of the substrate and a desired shape of the substrate.

* * * * *